(12) United States Patent
Jha et al.

(10) Patent No.: US 12,021,016 B2
(45) Date of Patent: Jun. 25, 2024

(54) THERMALLY ENHANCED SILICON BACK END LAYERS FOR IMPROVED THERMAL PERFORMANCE

(71) Applicant: Intel Corporation, Santa Clara, CA (US)

(72) Inventors: Chandra Mohan Jha, Tempe, AZ (US); Pooya Tadayon, Portland, OR (US); Aastha Uppal, Chandler, AZ (US); Weihua Tang, Chandler, AZ (US); Paul Diglio, Gaston, OR (US); Xavier Brun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 866 days.

(21) Appl. No.: 16/898,196

(22) Filed: Jun. 10, 2020

(65) Prior Publication Data

US 2021/0391244 A1    Dec. 16, 2021

(51) Int. Cl.
| | |
|---|---|
| *H01L 23/498* | (2006.01) |
| *H01L 21/56* | (2006.01) |
| *H01L 21/78* | (2006.01) |
| *H01L 23/373* | (2006.01) |
| *H01L 23/522* | (2006.01) |

(52) U.S. Cl.
CPC ...... *H01L 23/49833* (2013.01); *H01L 21/561* (2013.01); *H01L 21/78* (2013.01); *H01L 23/3732* (2013.01); *H01L 23/3738* (2013.01); *H01L 23/5226* (2013.01)

(58) Field of Classification Search
CPC . H01L 23/49833; H01L 21/561; H01L 21/78; H01L 23/3732; H01L 23/3738; H01L 23/5226; H01L 21/6835; H01L 2221/68354; H01L 21/6836; H01L 23/3672; H01L 2221/68327; H01L 2221/68368; H01L 23/3731
USPC ........................................................ 257/668
See application file for complete search history.

(56) References Cited

U.S. PATENT DOCUMENTS

| | | | | |
|---|---|---|---|---|
| 6,101,094 | A * | 8/2000 | Kermaani | H05K 1/141 257/713 |
| 6,730,972 | B2 * | 5/2004 | Ravi | C01B 32/15 977/932 |
| 7,405,102 | B2 * | 7/2008 | Lee | H01L 25/50 257/E21.705 |
| 8,368,206 | B2 * | 2/2013 | Shiraishi | H05K 3/107 257/713 |
| 9,147,637 | B2 * | 9/2015 | Otremba | H01L 24/40 |
| 9,368,720 | B1 * | 6/2016 | Moon | H10N 70/8828 |
| 9,390,996 | B2 * | 7/2016 | Jeon | H01L 23/3675 |
| 9,524,926 | B2 * | 12/2016 | Cook | H01L 23/49883 |
| 10,440,813 | B1 * | 10/2019 | Li | H01L 25/16 |
| 10,916,540 | B2 * | 2/2021 | El-Hinnawy | H01L 23/66 |
| 11,075,137 | B2 * | 7/2021 | Lin | H01L 25/0657 |

(Continued)

*Primary Examiner* — Vu A Vu
(74) *Attorney, Agent, or Firm* — Schwabe, Williamson & Wyatt P.C.

(57) ABSTRACT

Embodiments disclosed herein comprise a die and methods of forming a die. In an embodiment, a die comprises, a die substrate, wherein the die substrate has a first thermal conductivity, and a first layer over the die substrate, wherein the first layer has a second thermal conductivity that is greater than the first thermal conductivity. In an embodiment, the die further comprises a second layer over the first layer, wherein the second layer comprises transistors.

16 Claims, 11 Drawing Sheets

(56) References Cited

U.S. PATENT DOCUMENTS

| | | | | |
|---|---|---|---|---|
| 11,626,340 B2* | 4/2023 | Anderson | ............... | H01L 21/78 257/664 |
| 2020/0343156 A1* | 10/2020 | Okamoto | ................ | H01L 23/36 |

* cited by examiner

THERMALLY ENHANCED SILICON BACK END LAYERS FOR IMPROVED THERMAL PERFORMANCE

TECHNICAL FIELD

Embodiments of the present disclosure relate to semiconductor devices, and more particularly to semiconductor dies that include high thermal conductivity layers within the die to provide improved heat spreading.

BACKGROUND

Cooling of high power density regions in a die is critical to ensure high turbo and steady state performance of devices. Cooling solutions are particularly critical for enabling high performance mobile and server products. The thermal hot spots in a die are due to concentrated heat sources (e.g., a high density of transistors). Spreading the heat and removing the heat away from the die is challenging due to a high thermal resistance near the power source. Particularly, silicon used for the die has a relatively high thermal resistance. In order to support high performance and increased power, the die temperature needs to be maintained within the maximum acceptable temperature limits by dissipating heat away from the die efficiently. Furthermore, the presence of such hot spots is expected to become even more critical concern as three-dimensional (3D) stacking of transistor layers becomes more common.

Due to local temperature hot spots around transistor devices, silicon substrates run at high thermal reliability and throttling risks. Additionally, when the semiconductor die is overclocked, local temperatures may reach the reliability limit. Furthermore, thermal conditions are extreme during testing conditions that exceed the expected use case, which results in further stresses on the device. The present mitigation procedure involves reduction of $I_{CC}$ which reduces the total power. This leads to lower frequency specifications and reduced overclocking performance. Other solutions involve employing complicated and cost intensive package technologies and thermal solutions.

EMBODIMENTS OF THE PRESENT DISCLOSURE

Described herein are semiconductor dies that include high thermal conductivity layers within the die to provide improved heat spreading and methods of forming such semiconductor dies, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, thermal hotspots on the semiconductor die result in decreased performance. One reason for the hotspots is that silicon has a relatively high thermal resistance. Accordingly, heat is not adequately spread until it passes through a thermal interface material to the heat spreader. As such, embodiments disclosed herein include semiconductor dies that include a heat spreader layer that is over a device layer. The device layer is a layer (or layers) within a die that comprise transistor devices. In order to more rapidly spread the heat from transistor devices, the heat spreader layer is provided adjacent to the device layer. In an embodiment, the heat spreader layer has a thermal conductivity that is greater than a thermal conductivity of the die substrate. For example, the heat spreader layer may have a thermal conductivity that is approximately 250 W/m·K or greater. In an embodiment, the heat spreader layer may be, but is not limited to, silicon carbide, boron arsenide, boron phosphide, or diamond. A thickness of the heat spreader layer may be between approximately 10 μm and approximately 150 μm.

When the heat spreader layer is between the device layer and the die substrate, thermal spreading may occur before the thermal energy reaches the die substrate. As such, hotspots are more effectively reduced or eliminated. In some embodiments, the heat spreader layer is in direct contact with the device layer. In other embodiments, an interface layer or layers (e.g., for bonding) is provided between the device layer and the heat spreader layer.

In an embodiment, a single device layer and a single heat spreader layer are provided in a die. In other embodiments, multiple device layers and multiple heat spreader layers may be provided in a die. Such stacking allows for improved thermal performance even with advanced three-dimensional (3D) transistor stacking architectures.

Figure 1A:
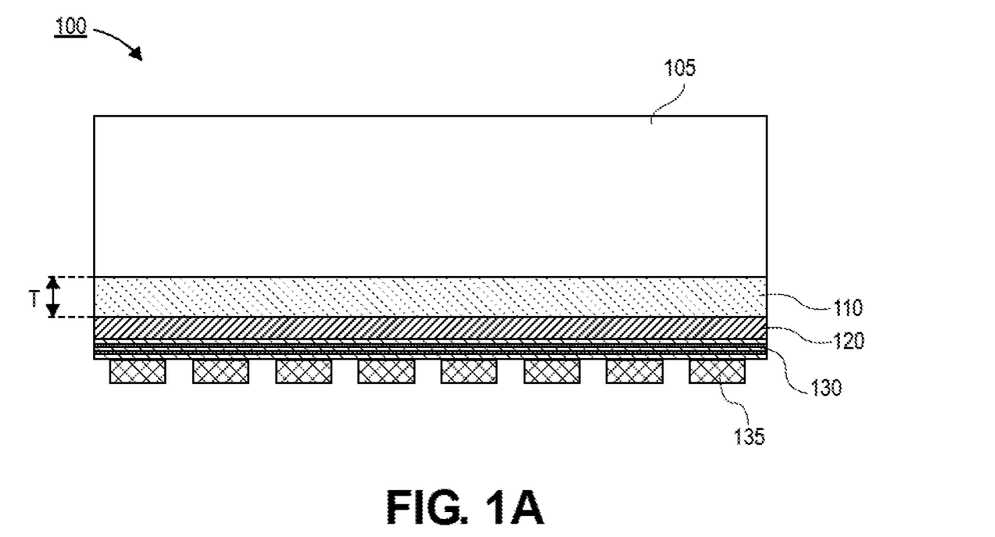
FIG. 1A is a cross-sectional illustration of a die with a heat spreader layer between the device layer and the die substrate, in accordance with an embodiment.

Referring now to FIG. 1A, a cross-sectional illustration of a die 100 is shown, in accordance with an embodiment. In an embodiment, the die 100 may comprise a die substrate 105, a heat spreader layer 110, a device layer 120, and an interconnect stack 130. Conductive bumps 135 (e.g., C4 bumps) may be disposed over the interconnect stack 130.

In an embodiment, the die substrate 105 may comprise a semiconductor material. For example, the die substrate 105 may comprise silicon. In other embodiments, the die substrate 105 may comprise a suitable substrate that has a higher thermal conductivity. For example, a silicon substrate may be replaced with a silicon carbide substrate. As such, the thermal conductivity through the die substrate 105 may be improved compared to a silicon die substrate 105.

In an embodiment, the heat spreader layer 110 may comprise a material that has a relatively higher thermal conductivity. Particularly, the die substrate 105 may have a first thermal conductivity, and the heat spreader layer 110 may have a second thermal conductivity that is greater than the first thermal conductivity. In an embodiment, the second thermal conductivity of the heat spreader layer 110 may be greater than approximately 250 W/m·K or greater. In some embodiments, the second thermal conductivity of the heat spreader layer 110 may be between approximately 250 W/m·K and approximately 1,000 W/m·K. For example, the heat spreader layer 110 may comprise materials, such as, but not limited to, silicon carbide, boron arsenide, boron phosphide, or diamond.

In an embodiment, the heat spreader layer 110 may have a thickness that provides a sufficient thermal mass to support spreading of heat from hot spots in the device layer. The thermal mass of the heat spreader layer 110 may be increased by increasing a thickness T of the heat spreader layer 110. In an embodiment, the thickness T may be approximately 10 μm or greater. In other embodiments, the thickness T of the heat spreader layer 110 may be between approximately 10 μm and 150 μm.

In an embodiment, the device layer 120 may comprise active components, such as transistors and the like. That is, the device layer 120 may comprise a semiconductor material that is processed to form transistors that each comprise a source, a gate, and a drain. The device layer 120 may include a non-uniform transistor density. That is, some regions of the device layer 120 may include a higher density of transistors than other regions of the device layer 120. As such, the device layer 120 is susceptible to the production of hot spots.

In an embodiment, the heat spreader layer 110 is positioned between the device layer 120 and the die substrate 105. In the particular embodiment shown in FIG. 1A, the heat spreader layer 110 directly contacts the device layer 120 and the die substrate 105. In other embodiments (described in greater detail below), the heat spreader layer 110 may be separated from the one or both of the device layer 120 and the die substrate 105 by interface layers (e.g., to enable bonding between the layers). The high thermal conductivity of the heat spreader layer 110 allows for the thermal energy of the hot spots in the device layer 120 to be spread more efficiently before reaching the die substrate 105. This is important because the die substrate 105 has a lower thermal conductivity, and may not provide adequate thermal spreading by itself. Accordingly, the presence of the heat spreader layer 110 between the device layer 120 and the die substrate 105 allows for improved efficiency in the die 100 that enables high power operation without exceeding the acceptable temperature limits.

In an embodiment, an interconnect stack 130 may be disposed over the device layer 120 opposite from the heat spreader layer 110. The interconnect stack 130 may sometimes be referred to as the back end of line (BEOL) layers. The interconnect stack 130 may comprise one or more layers of insulating material that surround conductive features (e.g., traces, pads, vias, etc.) that provide electrical coupling between the conductive bumps 135 (e.g., C4 bumps) and the transistors or other circuitry of the device layer 120.

Figure 1B:
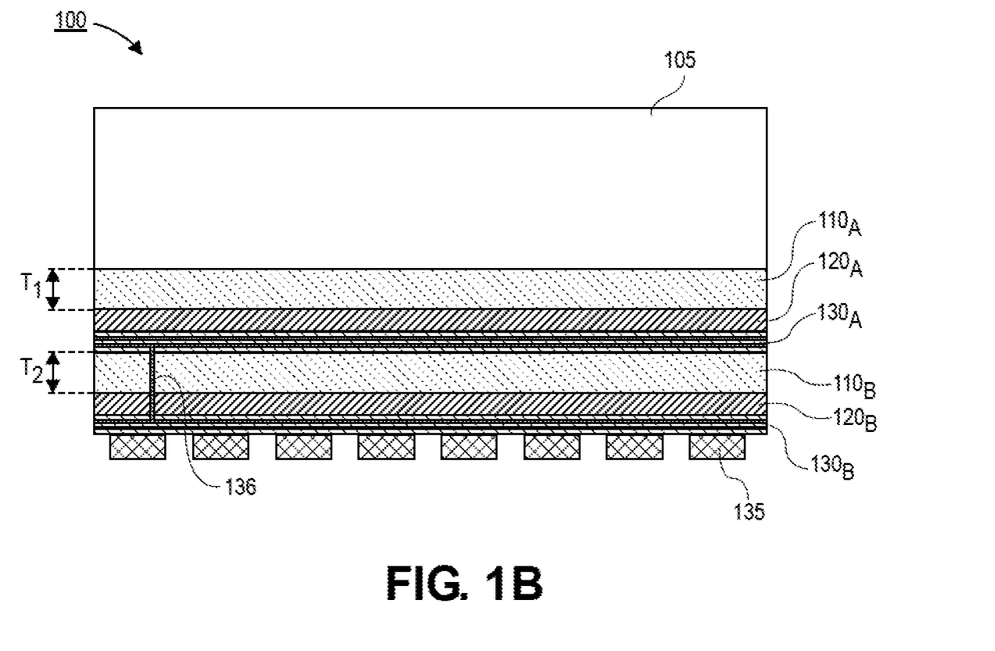
FIG. 1B is a cross-sectional illustration of a die with a first heat spreader layer over a first device layer and a second heat spreader layer over a second device layer, in accordance with an embodiment.

Referring now to FIG. 1B, a cross-sectional illustration of a die 100 is shown, in accordance with an additional embodiment. In the illustrated embodiment, the die 100 includes a 3D stacking architecture. That is, multiple device layers 120 may be stacked over each other to provide enhanced transistor density. For example, the die 100 may comprise a first device layer 120$_A$ and a second device layer 120$_B$. While two device layers 120 are shown in FIG. 1B, it is to be appreciated that embodiments may include any number of device layers 120 in the die 100.

In an embodiment, the first device layer 120$_A$ may be separated from the die substrate 105 by a first heat spreader layer 110$_A$. Additionally, a second heat spreader layer 110$_B$ may be positioned between the first device layer 120$_A$ and the second device layer 120$_B$. The second heat spreader layer 110$_B$ allows for thermal energy from hot spots in the second device layer 120$_B$ to be spread prior to reaching the first device layer 120$_A$. As such, the compounding effect of hot spots from multiple device layers 120 is mitigated.

In an embodiment, the first heat spreader layer 110$_A$ may have a first thickness $T_1$ and the second heat spreader layer 110$_B$ may have a second thickness $T_2$. The first thickness $T_1$ may be substantially similar to the second thickness $T_2$ in some embodiments. In other embodiments, the first thickness $T_1$ may be different than the second thickness $T_2$. Additionally, the first heat spreader layer 110$_A$ may comprise the same material as the second heat spreader layer 110$_B$. However, embodiments may also include a first heat spreader layer 110$_A$ that comprises a different material than the second heat spreader layer 110$_B$.

In an embodiment, a first interconnect stack 130$_A$ may also be provided between the first device layer 120$_A$ and the second device layer 120$_B$. Particularly, the first interconnect stack 130$_A$ may be positioned between the first device layer 120$_A$ and the second heat spreader layer 110$_B$. In an embodiment, a conductive via 136 may provide a vertical electrical connection to access the transistors of the first device layer 120$_A$. For example, the via 136 may electrically couple the first interconnect stack 130$_A$ to the second interconnect stack 130$_B$. The via 136 may pass through the second heat spreader layer 110$_B$. In some embodiments, the via 136 may also pass through the second device layer 120$_B$. A single via 136 is shown for illustrative purposes. However, it is to be appreciated that a plurality of vias 136 may be included to provide communicative coupling between the first device layer 120$_A$ and the second device layer 120$_B$ and/or between the first device layer 120$_A$ and the bumps 135.

Figure 1C:
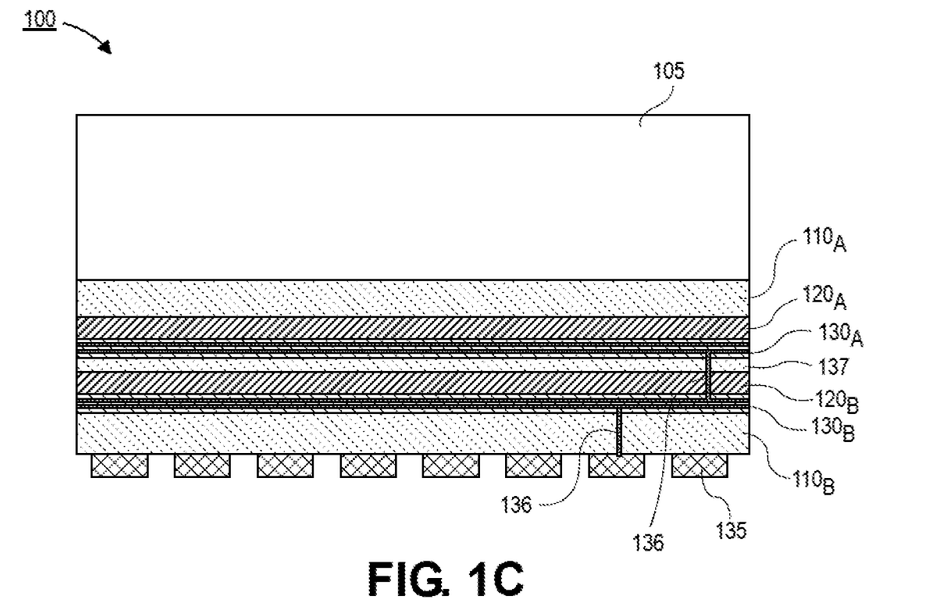
FIG. 1C is a cross-sectional illustration of die with a pair of heat spreader layers and a pair of device layers, in accordance with an embodiment.

Referring now to FIG. 1C, a cross-sectional illustration of a die 100 is shown, in accordance with an additional embodiment. In an embodiment, the die 100 comprises a first device layer 120$_A$ and a second device layer 120$_B$. In an embodiment, a first heat spreader layer 110$_A$ is between the die substrate 105 and the first device layer 120$_A$. An interface layer 137 may be positioned between the first interconnect stack 130$_A$ and the second device layer 120$_B$. The interface layer 137 may be a high thermal conductivity material, similar to the heat spreader layers 110. In other embodiments, the interface layer 137 may be an adhesive layer, or an interconnect layer.

In an embodiment, a second heat spreader layer 110$_B$ is positioned between the second device layer 120$_B$ and the bumps 135. For example, the second heat spreader layer 110$_B$ is in contact with the second interconnect stack 130$_B$. That is, in some embodiments, the heat spreader layers 110 may be spaced away from the device layer 120 by an interconnect stack. Additionally, as illustrated in FIG. 1C, a first device layer 120$_A$ and a second device layer 120$_B$ may be positioned between a pair of heat spreader layers 110$_A$ and 110$_B$. While two device layers 120 and two heat spreader layers 110 are shown in FIG. 1C, it is to be appreciated that embodiments may include any number of stacked device layers 120 and any number of heat spreader layers 110.

In an embodiment, the die 100 may comprise vias 136 to provide connections between the device layers 120 and between the device layers 120 and the bumps 135. For example, the vias 136 may pass through the interface layer 137 and the second heat spreader layer 110$_B$. The vias 136 may also pass through the second device layer 120$_B$ and through either of the interconnect stacks 130$_A$ and/or 130$_B$.

Referring now to FIGS. 2A-2E, a series of cross-sectional illustrations depicting a wafer level process for forming a die with a heat spreader layer over a device layer is shown, in accordance with an embodiment.

Figure 2A:
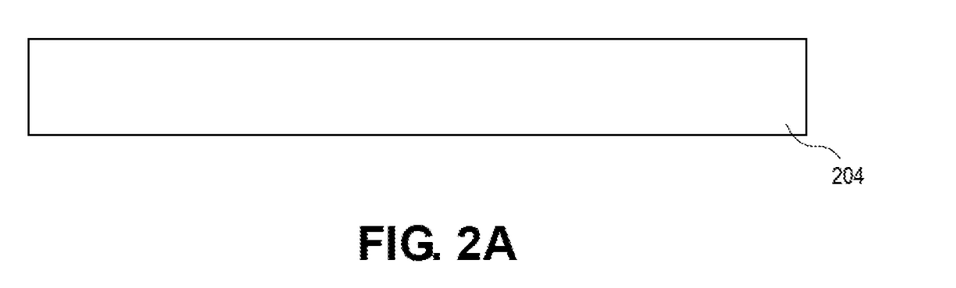
FIG. 2A is a cross-sectional illustration of a wafer, in accordance with an embodiment.

Referring now to FIG. 2A, a cross-sectional illustration of a wafer 204 is shown, in accordance with an embodiment. In an embodiment, the wafer 204 may have a first thermal conductivity. For example, the first thermal conductivity of the wafer 204 may be approximately 250 W/m·K or less. In an embodiment, the wafer 204 may be a semiconductor substrate. For example, the wafer 204 may be, but is not limited to, a silicon wafer or a silicon carbide wafer.

Figure 2B:
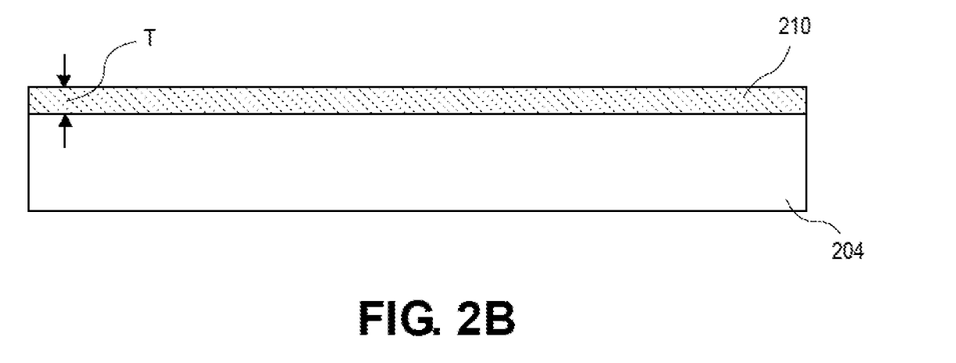
FIG. 2B is a cross-sectional illustration after a heat spreader layer is disposed over the wafer, in accordance with an embodiment.

Referring now to FIG. 2B, a cross-sectional illustration of the wafer 204 after a heat spreader layer 210 is disposed over a surface of the wafer 204 is shown, in accordance with an embodiment. The heat spreader layer 210 is blanket deposited over the surface of the wafer 204. That is, substantially an entire surface (e.g., the entire top surface of the wafer 204 in FIG. 2B) is covered by the heat spreader layer 210.

In an embodiment, the heat spreader layer 210 has a second thermal conductivity that is greater than the first thermal conductivity. For example, the second thermal conductivity of the heat spreader layer 210 may be approximately 250 W/m·K or greater. In an embodiment, the second thermal conductivity of the heat spreader layer 210 may be between approximately 250 W/m·K and approximately 1,000 W/m·K. In an embodiment, the heat spreader layer 210 may be, but is not limited to, silicon carbide, boron arsenide, boron phosphide, or diamond. A thickness T of the heat spreader layer 210 may be between approximately 10 µm and approximately 150 µm. In an embodiment, the heat spreader layer 210 may be disposed with any suitable deposition process. For example, the heat spreader layer 210 may be formed with a chemical vapor deposition (CVD) process.

Figure 2C:
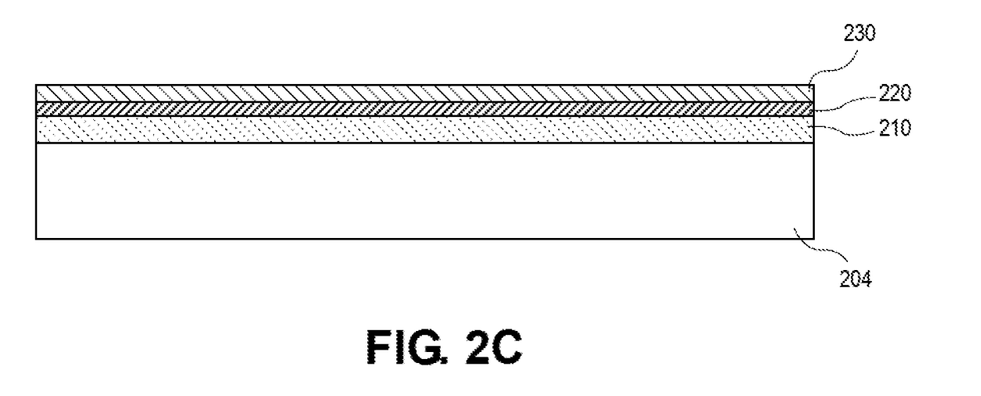
FIG. 2C is a cross-sectional illustrations after a device layer and an interconnect layer are disposed over the heat spreader layer, in accordance with an embodiment.

Referring now to FIG. 2C, a cross-sectional illustration of the wafer 204 after a device layer 220 and an interconnect stack 230 is disposed over the heat spreader layer 210. In an embodiment, the device layer 220 comprises a semiconductor material. For example, the device layer 220 may be silicon or the like. In a particular embodiment, the device layer 220 comprises a single crystal semiconductor layer. In an embodiment, the device layer 220 may comprise buffer layers in order to transition the crystal structure to a substantially defect free single crystal structure. The semiconductor material of the device layer 220 may be deposited with any suitable deposition process, such as, but not limited to atomic layer deposition (ALD), CVD, or the like. After the semiconductor layer of the device layer 220 is deposited, semiconductor fabrication process (e.g., lithographic patterning, etching, deposition, doping, etc.) may be implemented in order to manufacture transistors and the like (not shown) in the device layer.

As shown, an interconnect stack 230 (e.g., BEOL interconnect layers) may be fabricated over the device layer 220.

The interconnect stack 230 comprises one or more insulating layers with conductive features (e.g., traces, pads, vias, etc.) embedded therein.

Figure 2D:
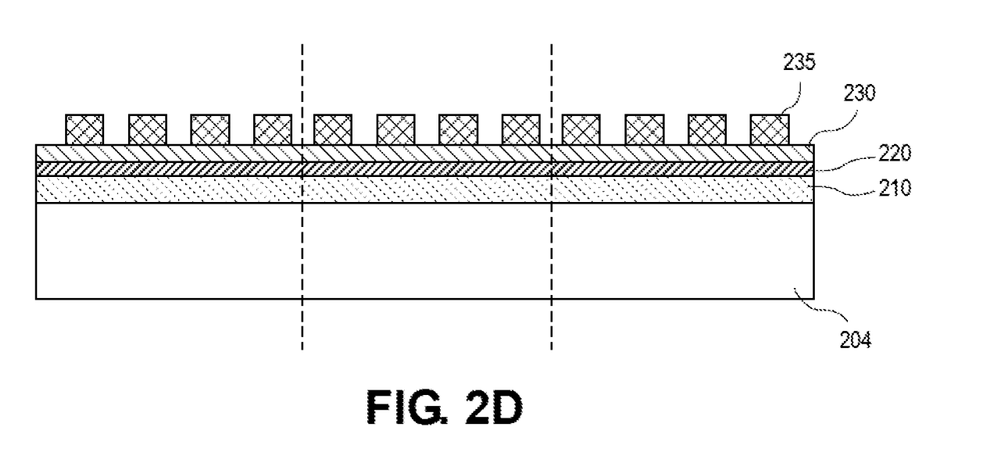
FIG. 2D is a cross-sectional illustration after bumps are disposed over the interconnect layer, in accordance with an embodiment.

Referring now to FIG. 2D, a cross-sectional illustration of the wafer 204 after bumps 235 are disposed over the interconnect stack 230 is shown, in accordance with an embodiment. The bumps 235 (e.g., C4 bumps or the like) may be electrically coupled to transistors in the device layer 220 by the interconnect stack 230. The bumps 235 may be fabricated using standard semiconductor manufacturing processes.

Figure 2E:
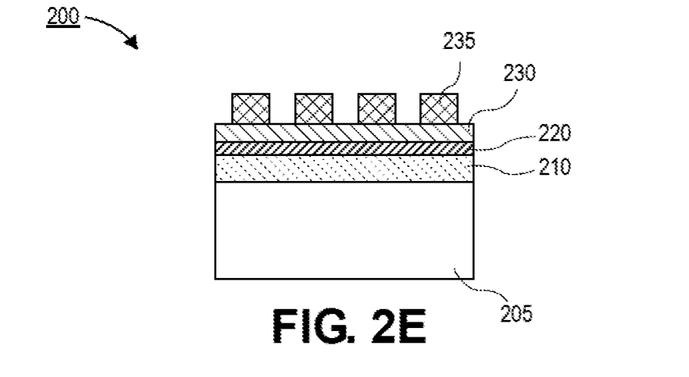
FIG. 2E is a cross-sectional illustration of a die that has been singulated from the wafer, in accordance with an embodiment.

Referring now to FIG. 2E, a cross-sectional illustration of a die 200 that has been singulated from the wafer 204 in FIG. 2D is shown, in accordance with an embodiment. In an embodiment, the wafer 204 may be singulated (e.g., by sawing, etching, laser ablation, combinations thereof, and the like) along scribe lines (indicated by the dashed lines in FIG. 2D). In an embodiment, the singulation may include cutting through each of the wafer 204, the heat spreader layer 210, the device layer 220, and the interconnect stack 230.

As shown, the die 200 comprises a die substrate 205, a heat spreader layer 210, a device layer 220, an interconnect stack 230, and bumps 235. In an embodiment, the heat spreader layer 210 is positioned between the device layer 220 and the die substrate 205. As such, thermal energy from hot spots in the device layer 220 may be efficiently spread by the high thermal conductivity heat spreader layer 210 before entering into the die substrate 205 with a lower thermal conductivity.

Figure 3A:
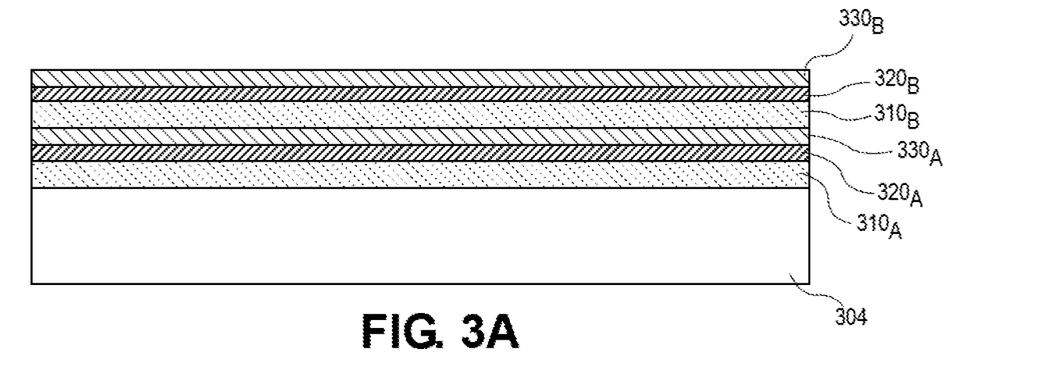
FIG. 3A is a cross-sectional illustration of a wafer with a pair of heat spreader layers and a pair of device layers, in accordance with an embodiment.
Figure 3B:
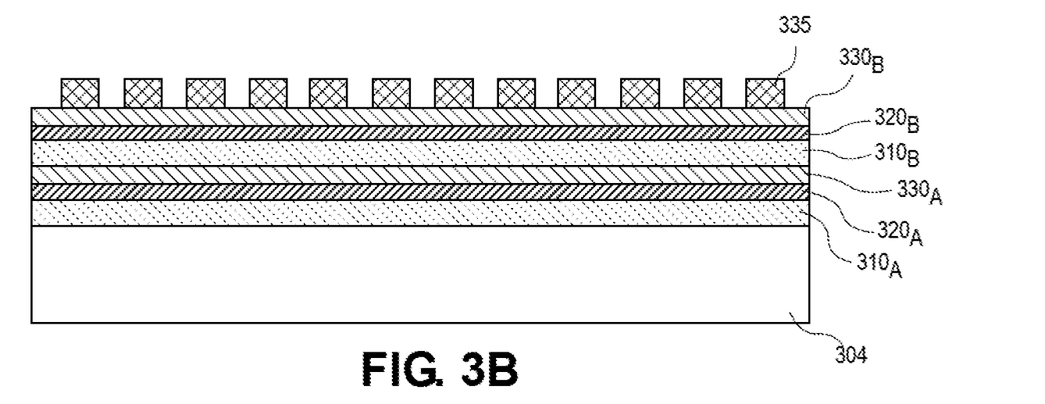
FIG. 3B is a cross-sectional illustration after bumps are disposed over the wafer, in accordance with an embodiment.
Figure 3C:
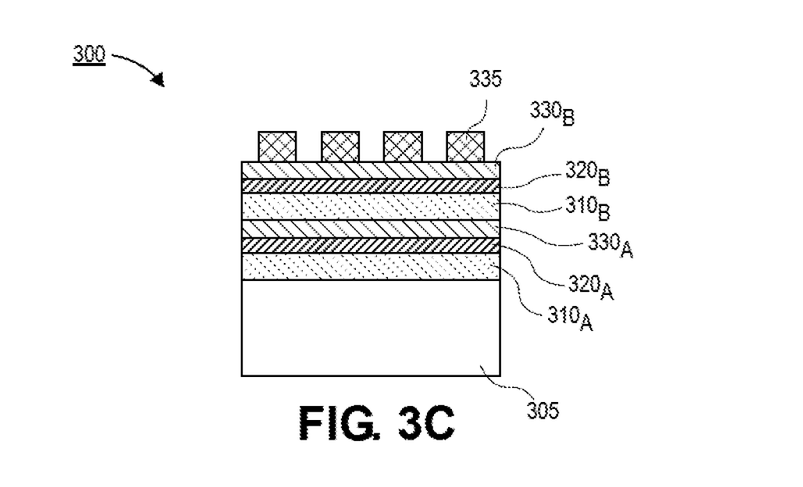
FIG. 3C is a cross-sectional illustration of a die that has been singulated from the wafer, in accordance with an embodiment.

Referring now to FIGS. 3A-3C, a series of cross-sectional illustrations of a process for forming a die 300 with a 3D device layer architecture is shown, in accordance with an embodiment.

Referring now to FIG. 3A, a cross-sectional illustration of a wafer 304 after a first device layer $320_A$ and a second device layer $320_B$ are formed on the wafer 304 is shown, in accordance with an embodiment. In an embodiment, the first device layer $320_A$ may be separated from the wafer 304 by a first heat spreader layer $310_A$. In an embodiment, a first interconnect stack $330_A$ may be disposed over the first device layer $320_A$. The first heat spreader layer $310_A$, the first device layer $320_A$, and the first interconnect stack $330_A$ may be substantially similar to the heat spreader layer 210, the device layer 220, and the interconnect stack 230 in FIG. 2C, respectively. For example, a second thermal conductivity of the first heat spreader layer $310_A$ may be approximately 250 W/m·K or greater. In an embodiment, the second thermal conductivity of the first heat spreader layer $310_A$ may be between approximately 250 W/m·K and approximately 1,000 W/m·K.

After the formation of the first interconnect stack $330_A$ a second heat spreader layer $310_B$ may be deposited over the wafer 304. In an embodiment, the second heat spreader layer $310_B$ may be substantially similar to the first heat spreader layer $310_A$. Particularly, the second heat spreader layer $310_B$ may have a third thermal conductivity that is greater than the first thermal conductivity of the wafer 304. For example, a third thermal conductivity of the second heat spreader layer $310_B$ may be approximately 250 W/m·K or greater. In an embodiment, the third thermal conductivity of the second heat spreader layer $310_B$ may be between approximately 250 W/m·K and approximately 1,000 W/m·K.

In an embodiment, a second device layer $320_B$ and a second interconnect stack $330_B$ may be disposed over the second heat spreader layer $310_B$. The second device layer $320_B$ and the second interconnect stack $330_B$ may be formed with substantially similar materials and processes as the first device layer $320_A$ and the first interconnect stack $330_A$. In an embodiment, vias (not shown) may pass through one or more of the second heat spreader layer $310_B$, the second device layer $320_B$, and the first interconnect stack $330_A$.

Referring now to FIG. 3B, a cross-sectional illustration of the wafer 304 after bumps 335 are disposed over the second interconnect stack $330_B$ is shown, in accordance with an embodiment. The bumps 335 may be C4 bumps or the like. The bumps 335 may be formed with standard semiconductor processing operations.

Referring now to FIG. 3C, a cross-sectional illustration of a die 300 that has been singulated from the wafer 304 in FIG. 3B is shown, in accordance with an embodiment. In an embodiment, the die 300 may comprise a die substrate 305, a first heat spreader layer $310_A$, a first device layer $320_A$, a first interconnect stack $330_A$, a second heat spreader layer $310_B$, a second device layer $320_B$, a second interconnect stack $330_B$, and bumps 335. In an embodiment, the wafer 304 may be singulated (e.g., by sawing, etching, laser ablation, combinations thereof, and the like) along scribe lines (not shown) between bumps 335. In an embodiment, the singulation may include cutting through each of the wafer 304, the heat spreader layers 310, the device layers 320, and the interconnect stacks 330.

Referring now to FIGS. 4A-4K, a series of illustrations depicting a process for forming a die 400 is shown, in accordance with an additional embodiment. The process in FIGS. 4A-4K allows for a singulation process that does not need to pass through the heat spreader layer. This is useful when the heat spreader layer is a material that is not able to be easily cut with standard sawing processes.

Figure 4A:
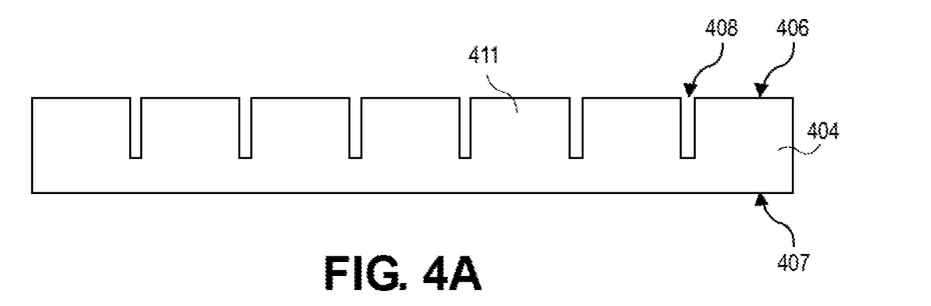
FIG. 4A is a cross-sectional illustration of a wafer after trenches are formed into the wafer to define die islands, in accordance with an embodiment.

Referring now to FIG. 4A, a cross-sectional illustration of a wafer 404 is shown, in accordance with an embodiment. The wafer 404 has a first surface 406 and a second surface 407. In an embodiment, trenches 408 are patterned into the first surface 406. The trenches define a plurality of die islands 411. Since the trenches 408 do not pass entirely through a thickness of the wafer 404, the die islands 411 remain connected to each other. In an embodiment, the wafer 404 has a first thermal conductivity. For example, the first thermal conductivity of the wafer 404 may be approximately 250 W/m·K or less. In an embodiment, the wafer 404 may be a semiconductor substrate. For example, the wafer 404 may be, but is not limited to, a silicon wafer or a silicon carbide wafer.

Figure 4B:
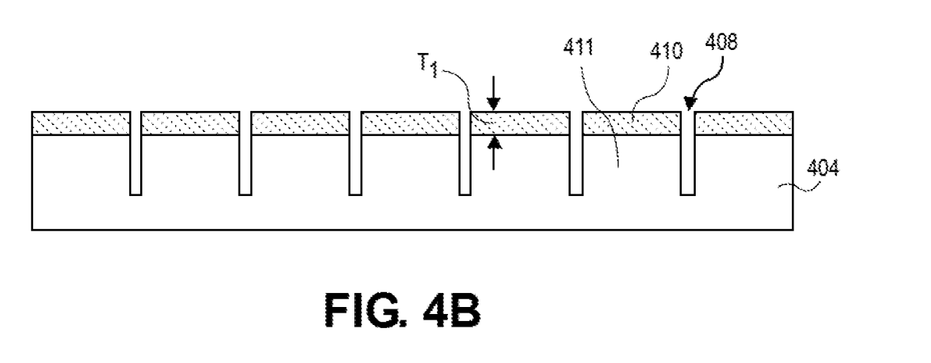
FIG. 4B is a cross-sectional illustration of the wafer after a heat spreader layer is disposed over the die islands, in accordance with an embodiment.

Referring now to FIG. 4B, a cross-sectional illustration of the wafer 404 after a heat spreader layer 410 is disposed over the top surfaces of the die islands 411 is shown, in accordance with an embodiment. In an embodiment, the heat spreader layer 410 comprises a second thermal conductivity that is greater than the first thermal conductivity. For example, the second thermal conductivity of the heat spreader layer 410 may be approximately 250 W/m·K or greater. In an embodiment, the second thermal conductivity of the heat spreader layer 410 may be between approximately 250 W/m·K and approximately 1,000 W/m·K. In an embodiment, the heat spreader layer 410 may be, but is not limited to, silicon carbide, boron arsenide, boron phosphide, or diamond. A thickness $T_1$ of the heat spreader layer 410 may be between approximately 10 μm and approximately 150 μm.

In an embodiment, the heat spreader layer 410 is deposited with a suitable deposition process, such as CVD or the like. In an embodiment, the trenches 408 have a high aspect ratio, and are therefore, not substantially filled by the heat spreader layer 410. However, as will be described in greater detail below, portions of the sidewalls of the die islands 411 may also be covered by the heat spreader layer 410. Furthermore, it is to be appreciated that the heat spreader layer 410 is not a continuous layer. For example, gaps in the heat spreader layer 410 may be substantially aligned with the trenches 408.

Figure 4C:
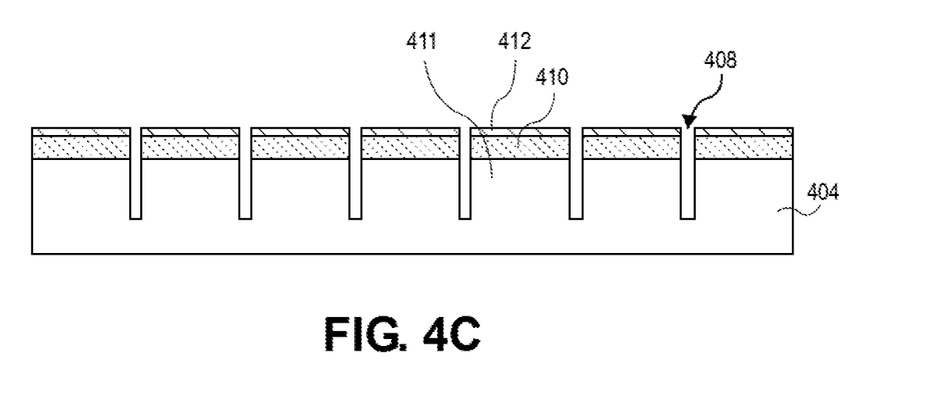
FIG. 4C is a cross-sectional illustration after an interface layer is disposed over the first layer, in accordance with an embodiment.

Referring now to FIG. 4C, a cross-sectional illustration of the wafer 404 after a first interface layer 412 is disposed over the heat spreader layer 410 is shown, in accordance with an embodiment. The first interface layer 412 may be a material that allows for improved bonding with a subsequently attached device layer (not shown in FIG. 4C). In an embodiment, the interface layer 412 may be, but is not limited to, silicon nitride. In an embodiment, the first interface layer 412 is deposited with any suitable deposition process (e.g., CVD, or the like). In an embodiment, the first interface layer 412 may be planarized with a planarization process (e.g., chemical mechanical planarization (CMP).

Figure 4D:
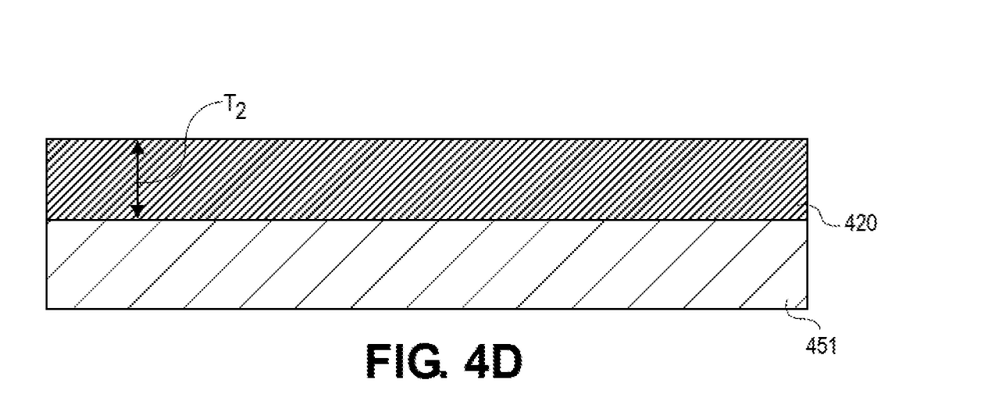
FIG. 4D is a cross-sectional illustration of a device layer on a carrier, in accordance with an embodiment.

Referring now to FIG. 4D, a cross-sectional illustration of a device layer 420 is shown, in accordance with an embodiment. In an embodiment, the device layer 420 may comprise transistor devices (not shown). In an embodiment, the device layer 420 may also comprise an interconnect stack (not shown). The device layer 420 may have a second thickness $T_2$. The second thickness $T_2$ is suitable for handling the device layer 420 as it is processed. After the transistors and interconnect stack are formed in the device layer 420, the device layer 420 is attached to a carrier 451.

Figure 4E:
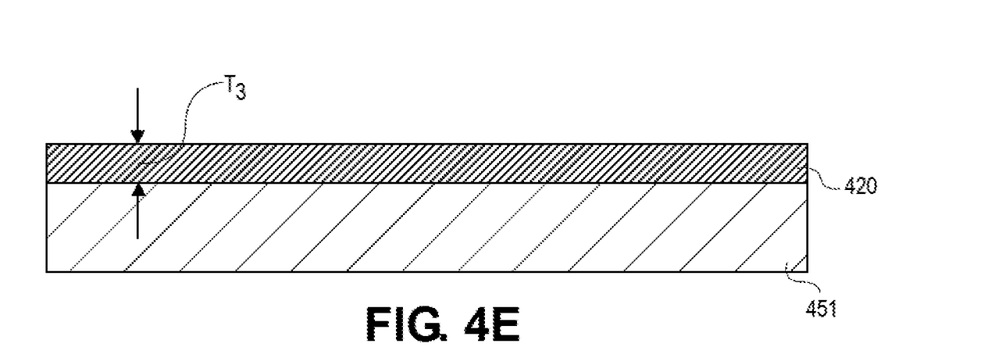
FIG. 4E is a cross-sectional illustration after the device layer is recessed, in accordance with an embodiment.

Referring now to FIG. 4E, a cross-sectional illustration of the device layer 420 after it is recessed to a third thickness $T_3$ is shown, in accordance with an embodiment. The device layer 420 may be recessed with a grinding process or the like.

Figure 4F:
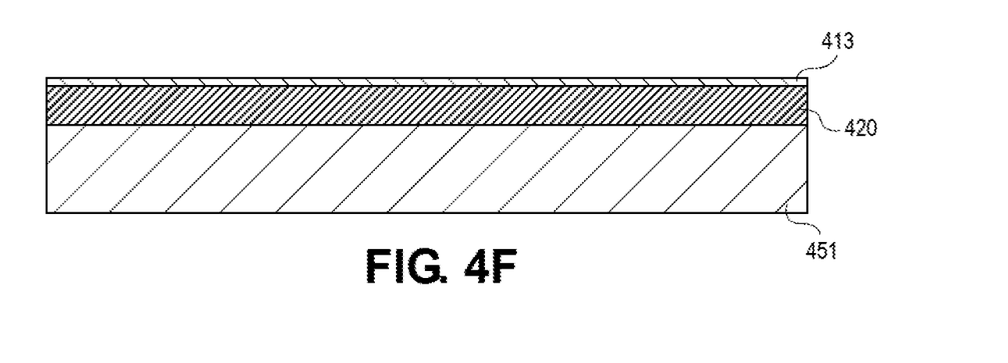
FIG. 4F is a cross-sectional illustration after an interface layer is disposed over the device layer, in accordance with an embodiment.

Referring now to FIG. 4F, a cross-sectional illustration of the device layer 420 after a second interface layer 413 is disposed over the device layer 420 is shown, in accordance with an embodiment. The second interface layer 413 may be a material that allows for improved bonding with the first interface layer 412. In an embodiment, the second interface layer 413 may be, but is not limited to, silicon nitride. In an embodiment, the second interface layer 413 is deposited with any suitable deposition process (e.g., CVD, or the like). In an embodiment, the second interface layer 413 may be planarized with a planarization process (e.g., chemical mechanical planarization (CMP).

Figure 4G:
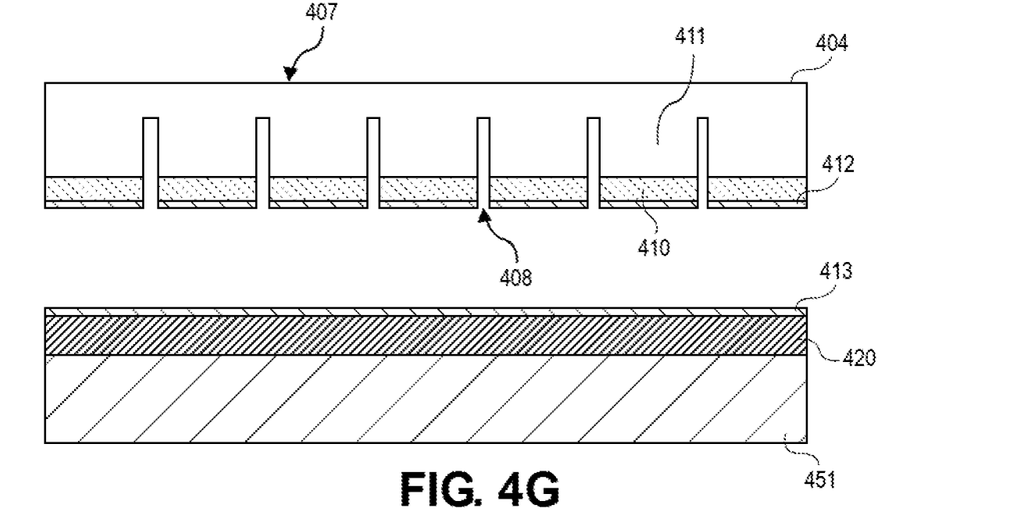
FIG. 4G is a cross-sectional illustration of the wafer aligned over the device layer, in accordance with an embodiment.

Referring now to FIG. 4G, a cross-sectional illustration of the wafer 404 aligned over the device layer 420 is shown, in accordance with an embodiment. In an embodiment, the wafer 404 is flipped over so that the second surface 407 faces away from the device layer 420.

Figure 4H:
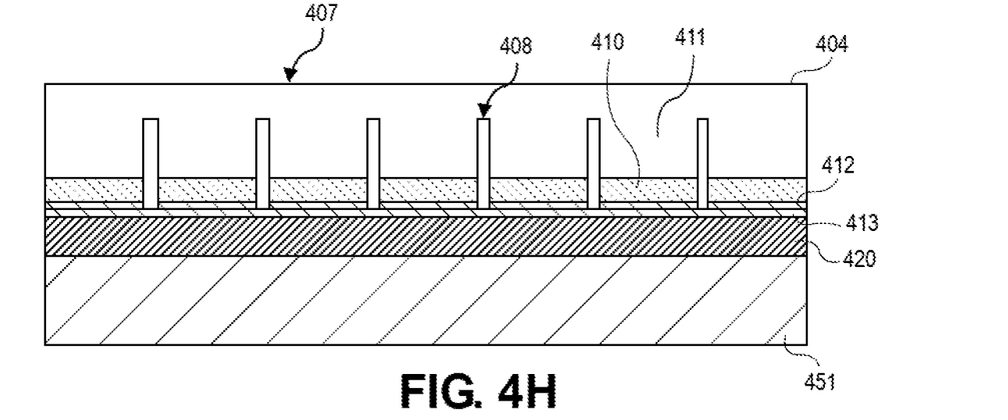
FIG. 4H is a cross-sectional illustration after the wafer is attached to the device layer, in accordance with an embodiment.

Referring now to FIG. 4H, a cross-sectional illustration of after the wafer 404 is attached to the device layer 420 is shown, in accordance with an embodiment. As shown, the first interface layer 412 is in direct contact with the second interface layer 413. In some embodiments, an annealing process may improve the bond between the first interface layer 412 and the second interface layer 413.

Figure 4I:
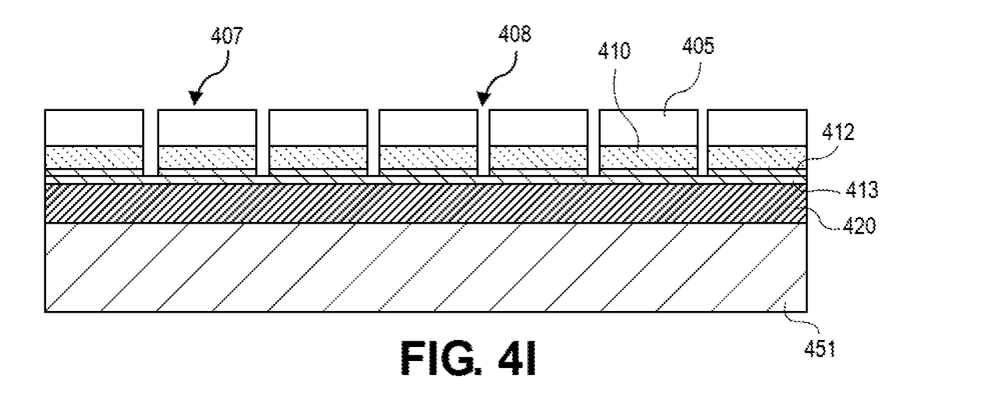
FIG. 4I is a cross-sectional illustration after the wafer is recessed to release the die islands to form a plurality of dies, in accordance with an embodiment.

Referring now to FIG. 4I, a cross-sectional illustration after the wafer 404 is recessed is shown, in accordance with an embodiment. The recessing process (e.g., grinding, etc.) releases each of the die islands 411 in order to form a plurality of discrete die substrates 405.

Figure 4J:
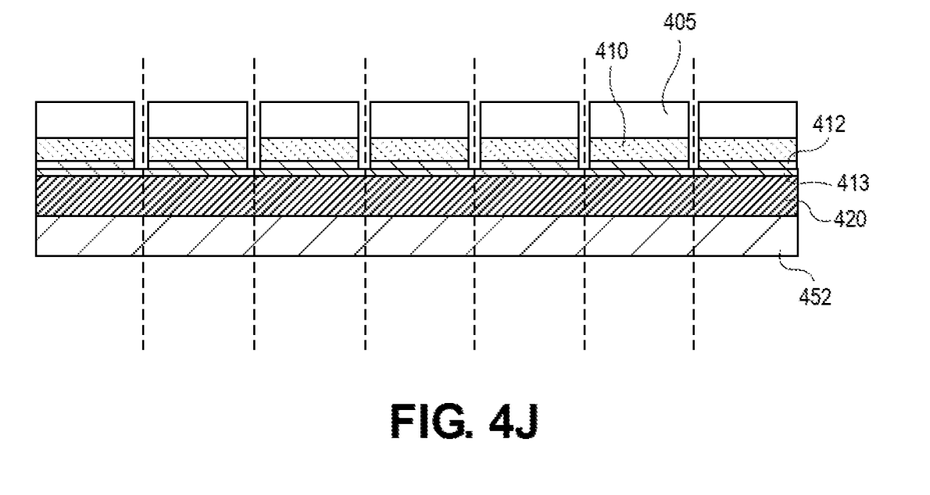
FIG. 4J is a cross-sectional illustration showing the scribe lines for singulating the structure, in accordance with an embodiment.

Referring now to FIG. 4J, a cross-sectional illustration of the wafer level device showing the scribe lines (dashed lines) is shown, in accordance with an embodiment. As shown, the scribe lines do not pass through the heat spreader layer 410. Accordingly, the singulation process is simplified.

The wafer level device of FIG. 4I may be transferred from the carrier 451 to a dicing tape 452 or the like in order to implement the singulation process.

Figure 4K:
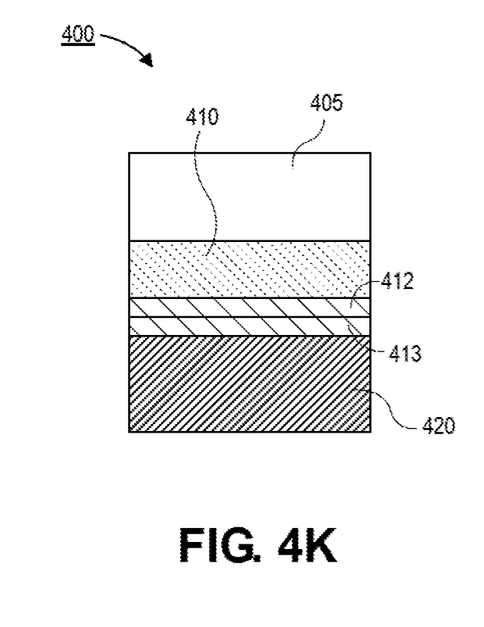
FIG. 4K is a cross-sectional illustration of a die singulated from the structure in accordance with an embodiment.

Referring now to FIG. 4K, a cross-sectional illustration of a die 400 that has been singulated from the wafer level device of FIG. 4J is shown, in accordance with an embodiment. In an embodiment, the die 400 comprises a device layer 420, a first interface layer 412, a second interface layer 413, a heat spreader layer 410, and a die substrate 405. Particularly, as shown in FIG. 4K, the heat spreader layer 410 may be separated from the device layer 420 by one or more intervening layers (e.g., the first interface layer 412 and the second interface layer 413.

Figure 4L:
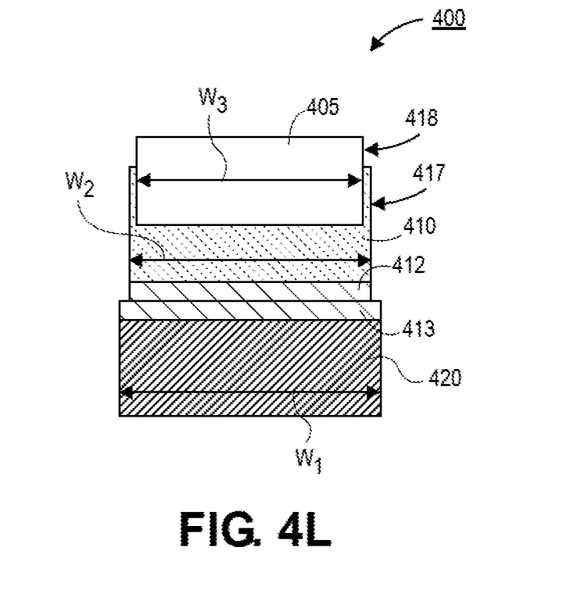
FIG. 4L is a cross-sectional illustration of a die singulated from the structure, where the heat spreader layer extends over sidewalls of the die, in accordance with an embodiment.

Referring now to FIG. 4L, a cross-sectional illustration of a die 400 is shown, in accordance with an additional embodiment. The die 400 in FIG. 4L differs from the die 400 in FIG. 4K in several ways. One difference is that the widths of the layers is non-uniform. For example, the device layer 420 may have a first width $W_1$, the heat spreader layer 410 may have a second width $W_2$, and the die substrate 405 may have a third width $W_3$. The larger first width $W_1$ may be the result of the singulation process using a saw with a width that is smaller than the width of the trenches 408. The second width $W_2$ may be larger than the third width $W_3$ because the deposition process used for the heat spreader layer 410 may result in portions of the heat spreader layer 410 extending over the edges of the die islands 411.

Another difference between the die 400 in FIG. 4L and the die 400 in FIG. 4K is that the heat spreader layer 410 may extend over portions of sidewalls 418 of the die substrate 405. For example, a portion 417 of the heat spreader layer 410 extends down along sidewalls 418 of the die substrate 405. This feature may result from portions of the heat spreader layer 410 depositing in the trench 408 during the deposition process.

Figure 4M:
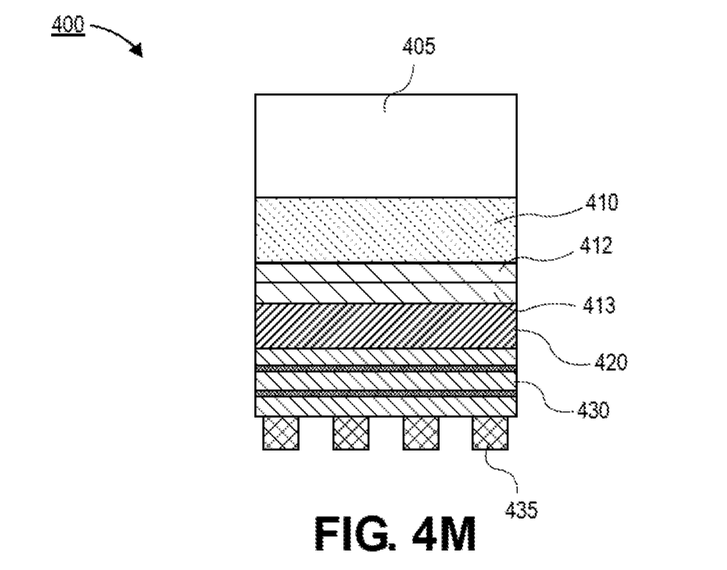
FIG. 4M is a cross-sectional illustration of a singulated die that illustrates an interconnect layer over the device layer, in accordance with an embodiment.
Figure 4N:
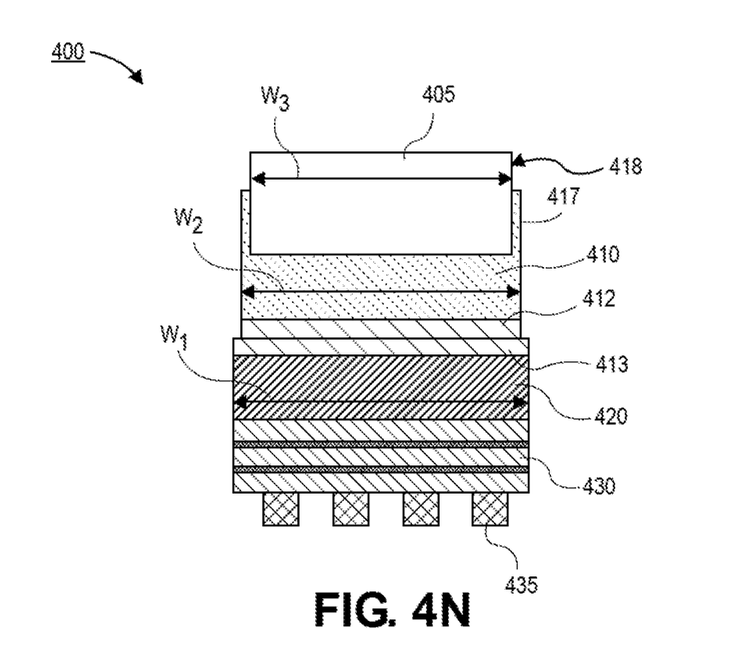
FIG. 4N is a cross-sectional illustration of a singulated die that illustrates an interconnect layer over the device layer, where the heat spreader layer covers sidewall surfaces of the die, in accordance with an embodiment.

Referring now to FIGS. 4M and 4N, cross-sectional illustrations of dies 400 that illustrate the interconnect stacks 430 and bumps 435 are shown, in accordance with additional embodiment.

Referring now to FIG. 4M, a cross-sectional illustration of a die 400 is shown, in accordance with an embodiment. The die 400 in FIG. 4M is substantially similar to the die 400 in FIG. 4K, with the exception that an interconnect stack 430 and the bumps 435 are shown. In an embodiment, the interconnect stack 430 is disposed over a surface of the device layer 420 opposite from the heat spreader layer 410. The bumps 435 (e.g., C4 bumps) are disposed over the interconnect stack 430.

Referring now to FIG. 4N, a cross-sectional illustration of a die 400 is shown, in accordance with an additional embodiment. The die 400 in FIG. 4N is substantially similar to the die 400 in FIG. 4L, with the exception that an interconnect stack 430 and the bumps 435 are shown. As shown, the interconnect stack 430 may have the same width $W_1$ as the device layer 420.

Figure 5:
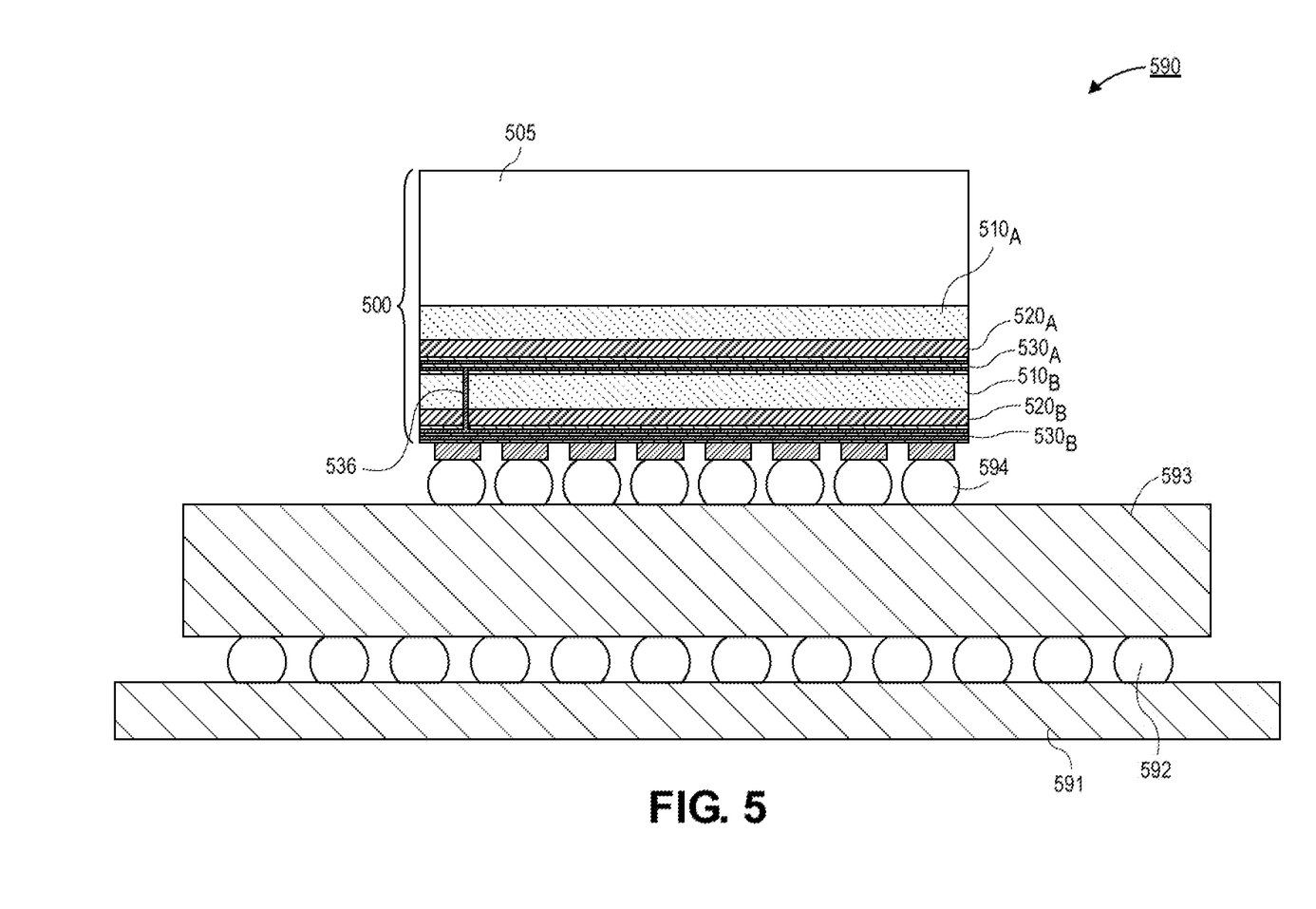
FIG. 5 is a cross-sectional illustration of an electronic system that comprises a die with a pair of heat spreader layers over device layers, in accordance with an embodiment.

Referring now to FIG. 5, a cross-sectional illustration of an electronic system 590 is shown, in accordance with an embodiment. In an embodiment, the electronic system 590 comprises a board 591 and a package substrate 593 attached to the board 591 by interconnects 592. The interconnects 592 are shown as solder bumps, but any interconnect architecture (e.g., wire bonds, sockets, etc.) may be used to connect the package substrate 593 to the board 591. In an embodiment, a die 500 is attached to the package substrate 593 by interconnects 594. The interconnects 594 are shown as solder balls, but it is to be appreciated that any suitable first level interconnect (FLI) architecture may be used.

In an embodiment, the die 500 shown is substantially similar to the die 100 in FIG. 1B. For example, the die 500 comprises a die substrate 505, a first heat spreader layer 510A, a first device layer 520A, a first interconnect stack 530A, a second heat spreader layer 510B, a second device layer 520B, and a second interconnect stack 530B. One or more vias 536 may be used to provide interconnects between the device layers 520. While a die 500 similar to the die 100 in FIG. 1B is shown, it is to be appreciated that the die 500 may be similar to any of the embodiments described herein.

Figure 6:
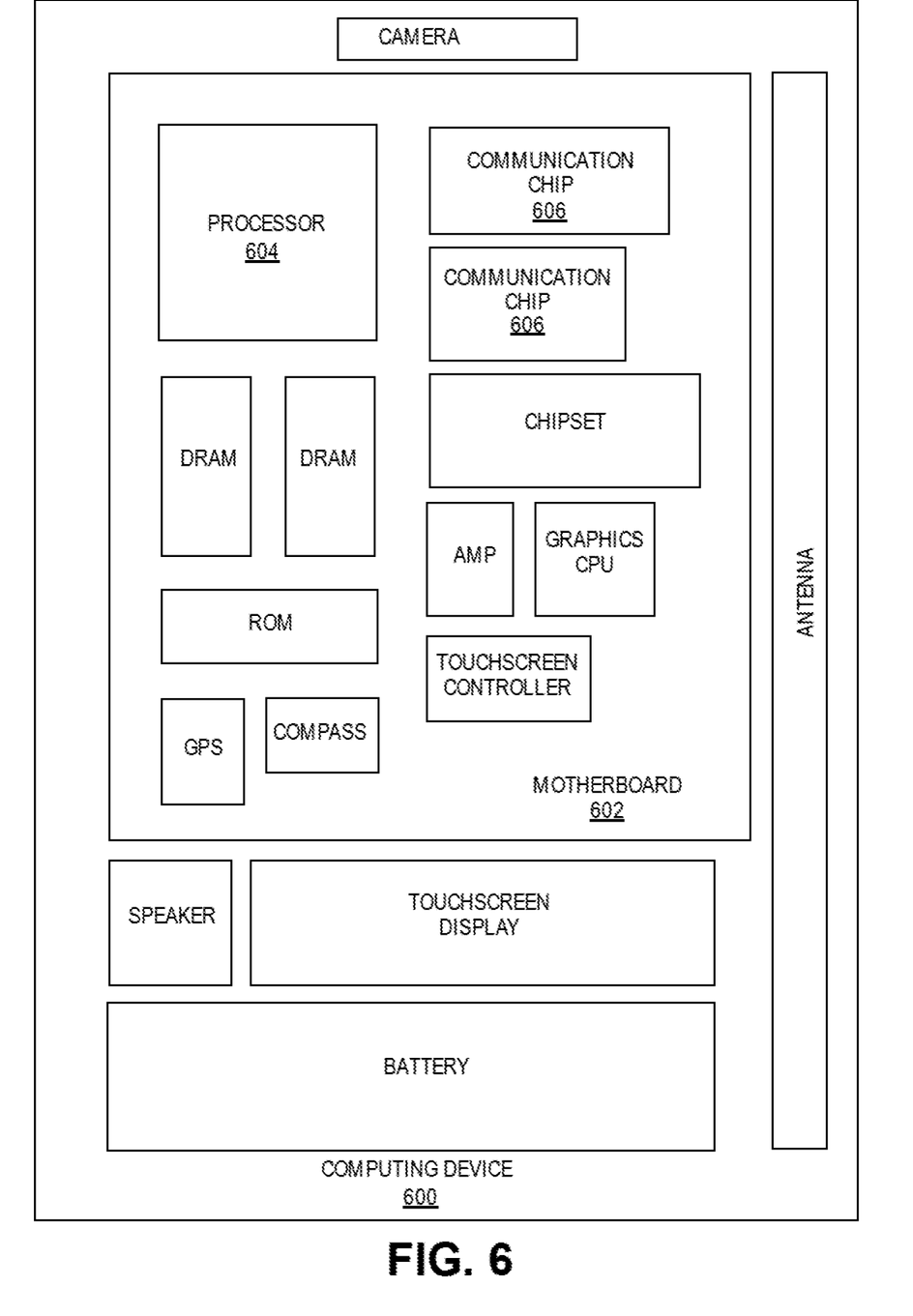
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may include a heat spreader layer between the device layer and a die substrate, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may include a heat spreader layer between the device layer and a die substrate, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a die, comprising: a die substrate, wherein the die substrate has a first thermal conductivity; a first layer over the die substrate, wherein the first layer has a second thermal conductivity that is greater than the first thermal conductivity; and a second layer over the first layer, wherein the second layer comprises transistors.

Example 2: the die of Example 1, wherein a thickness of the first layer is between approximately 10 μm and approximately 150 μm.

Example 3: the die of Example 1 or Example 2, wherein the second thermal conductivity is approximately 250 W/m·K or greater.

Example 4: the die of Examples 1-3, wherein the first layer comprises silicon and carbon, boron and arsenic, boron and phosphorous, or carbon with a diamond crystal structure.

Example 5: the die of Examples 1-4, wherein the die substrate comprises silicon or silicon and carbon.

Example 6: the die of Examples 1-5, further comprising: a third layer comprising transistors; and a fourth layer, wherein the fourth layer comprises a third thermal conductivity that is greater than the first thermal conductivity.

Example 7: the die of Example 6, wherein the first layer is between the die substrate and the second layer, and wherein the third layer is between the second layer and the fourth layer.

Example 8: the die of Example 7, further comprising: a conductive interconnect between the second layer and the fourth layer, wherein the conductive interconnect passes through the third layer.

Example 9: the die of Example 6, wherein the first layer is between the die and the second layer, and wherein the fourth layer is between the second layer and the third layer.

Example 10: the die of Examples 1-9, wherein the second layer comprises a semiconductor layer and an interconnect layer over the semiconductor layer.

Example 11: the die of Examples 1-10, wherein the first layer is in direct contact with the second layer.

Example 12: the die of Examples 1-11, further comprising: an interface layer between the first layer and the second layer.

Example 13: the die of Examples 1-12, wherein a width of the first layer is substantially equal to a width of the die substrate.

Example 14: the die of Examples 1-13, wherein a width of the first layer is larger than a width of the die substrate.

Example 15: the die of Example 14, wherein the first layer covers a first surface of the die substrate and sidewall surfaces of the die substrate.

Example 16: the die of Example 14, wherein a width of the second layer is larger than a width of the first layer.

Example 17: a method of forming a die, comprising: forming trenches into a first surface of a die substrate, wherein the trenches define a plurality of die islands; disposing a first layer over the die substrate, wherein the first layer covers the plurality of die islands without substantially filling the trenches; attaching a second layer to the first layer, wherein the second layer comprises transistors, and wherein the second layer extends over the trenches; recessing a second surface of the die substrate so that the plurality of die islands are released from each other; and singulating the second layer to provide individual dies, wherein individual dies comprise: an individual one of the die islands; the first layer; and the second layer.

Example 18: the method of Example 17, wherein the die island has a first thermal conductivity, and wherein the first layer has a second thermal conductivity that is greater than the first thermal conductivity.

Example 19: the method of Example 17 or Example 18, wherein the first layer is disposed over the die substrate with a chemical vapor deposition (CVD) process.

Example 20: the method of Examples 17-19, wherein singulating the second layer is implemented without having to cut through the first layer.

Example 21: the method of Examples 17-20, wherein an interface layer is disposed between the second layer and the first layer.

Example 22: the method of Example 21, wherein the interface layer comprises silicon and nitrogen.

Example 23: an electronic system, comprising: a board; a package substrate attached to the board; and a die electrically coupled to the package substrate, wherein the die comprises: a die substrate, wherein the die substrate has a first thermal conductivity; a first layer over the die substrate, wherein the first layer has a second thermal conductivity that is greater than the first thermal conductivity; and a second layer over the first layer, wherein the second layer comprises transistors.

Example 24: the electronic system of Example 23, further comprising: a third layer comprising transistors; and a fourth layer, wherein the fourth layer comprises a third thermal conductivity that is greater than the first thermal conductivity.

Example 25: the electronic system of Example 23 or Example 24, wherein the first layer covers a first surface of the die substrate and sidewall surfaces of the die substrate.

What is claimed is:

1. A die, comprising:
   a die substrate, wherein the die substrate has a first thermal conductivity;
   a first layer over the die substrate, wherein the first layer has a second thermal conductivity that is greater than the first thermal conductivity;
   a second layer over the first layer, wherein the second layer comprises transistors;
   a third layer comprising transistors; and
   a fourth layer, wherein the fourth layer comprises a third thermal conductivity that is greater than the first thermal conductivity, wherein the first layer is between the die substrate and the second layer, and wherein the third layer is between the second layer and the fourth layer.

2. The die of claim 1, wherein a thickness of the first layer is between approximately 10 μm and approximately 150 μm.

3. The die of claim 1, wherein the second thermal conductivity is approximately 250 W/m·K or greater.

4. The die of claim 1, wherein the first layer comprises silicon and carbon, boron and arsenic, boron and phosphorous, or carbon with a diamond crystal structure.

5. The die of claim 1, wherein the die substrate comprises silicon or silicon and carbon.

6. The die of claim 1, further comprising:
   a conductive interconnect between the second layer and the fourth layer, wherein the conductive interconnect passes through the third layer.

7. The die of claim 1, wherein the second layer comprises a semiconductor layer and an interconnect layer over the semiconductor layer.

8. The die of claim 1, wherein the first layer is in direct contact with the second layer.

9. The die of claim 1, further comprising:
   an interface layer between the first layer and the second layer.

10. The die of claim 1, wherein a width of the first layer is substantially equal to a width of the die substrate.

11. The die of claim 1, wherein a width of the first layer is larger than a width of the die substrate.

12. The die of claim 11, wherein the first layer covers a first surface of the die substrate and sidewall surfaces of the die substrate.

13. The die of claim 11, wherein a width of the second layer is larger than a width of the first layer.

14. A die, comprising:
   a die substrate, wherein the die substrate has a first thermal conductivity;
   a first layer over the die substrate, wherein the first layer has a second thermal conductivity that is greater than the first thermal conductivity;
   a second layer over the first layer, wherein the second layer comprises transistors;
   a third layer comprising transistors; and
   a fourth layer, wherein the fourth layer comprises a third thermal conductivity that is greater than the first thermal conductivity, wherein the first layer is between the die and the second layer, and wherein the fourth layer is between the second layer and the third layer.

15. An electronic system, comprising:
   a board;
   a package substrate attached to the board; and
   a die electrically coupled to the package substrate, wherein the die comprises:
     a die substrate, wherein the die substrate has a first thermal conductivity;
     a first layer over the die substrate, wherein the first layer has a second thermal conductivity that is greater than the first thermal conductivity;
     a second layer over the first layer, wherein the second layer comprises transistors;
     a third layer comprising transistors; and
     a fourth layer, wherein the fourth layer comprises a third thermal conductivity that is greater than the first thermal conductivity, wherein the first layer is between the die substrate and the second layer, and wherein the third layer is between the second layer and the fourth layer.

16. The electronic system of claim 15, wherein the first layer covers a first surface of the die substrate and sidewall surfaces of the die substrate.

* * * * *